(12) United States Patent
Liu et al.

(10) Patent No.: US 7,196,392 B2
(45) Date of Patent: Mar. 27, 2007

(54) SEMICONDUCTOR STRUCTURE FOR ISOLATING INTEGRATED CIRCUITS OF VARIOUS OPERATION VOLTAGES

(75) Inventors: Jun-Xiu Liu, Taichung (TW); Chi-Hsuen Chang, Hsin-Chu (TW); Tzu-Chiang Sung, Jhubei (TW); Chung-I Chen, Hsin-Chu (TW); Chih Po Huang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 93 days.

(21) Appl. No.: 11/136,810

(22) Filed: May 24, 2005

(65) Prior Publication Data

US 2006/0113571 A1    Jun. 1, 2006

Related U.S. Application Data

(60) Provisional application No. 60/631,301, filed on Nov. 29, 2004.

(51) Int. Cl.
*H01L 29/00*     (2006.01)

(52) U.S. Cl. ............ 257/500; 257/504; 257/544; 257/409; 257/E27.013

(58) Field of Classification Search ........... 257/500
See application file for complete search history.

(56) References Cited

U.S. PATENT DOCUMENTS

2005/0042815 A1*   2/2005   Williams et al. ............ 438/202

* cited by examiner

*Primary Examiner*—Tu-Tu Ho
(74) *Attorney, Agent, or Firm*—Kirkpatrick & Lockhart Preston Gates Ellis LLP

(57) ABSTRACT

A semiconductor structure includes an isolation ring disposed on a semiconductor substrate, surrounding first and second circuit areas. A buried isolation layer is continuously extended through the first circuit area and the second circuit area, in the semiconductor substrate. The buried isolation layer interfaces with the isolation ring, thereby isolating the first and second circuit areas from a backside bias of the semiconductor substrate. An ion enhanced isolation layer separates the first well in the first circuit area and the second well in the second circuit areas from the isolation ring and the buried isolation layer, thereby preventing punch-through between the wells of the circuit areas and the buried isolation layer.

18 Claims, 3 Drawing Sheets

SEMICONDUCTOR STRUCTURE FOR ISOLATING INTEGRATED CIRCUITS OF VARIOUS OPERATION VOLTAGES

The present application claims the benefits of U.S. Provisional Patent Application Ser. No. 60/631,301, which was filed on Nov. 29, 2004 and entitled "SEMICONDUCTOR STRUCTURE FOR ISOLATING INTEGRATED CIRCUITS OF VARIOUS OPERATION VOLTAGES."

BACKGROUND

The present invention relates generally to semiconductor designs, and more particularly to a semiconductor structure that isolates devices of various operation voltages.

A system on chip (SOC) may include a plurality of circuit areas that operate at different voltage levels. For example, a liquid crystal display (LCD) driver may include various circuit areas that operate at a low (1.8 or 2.5 V) voltage, medium voltage (3.3 or 5 V), and high (30 or 40 V) voltage. The operating voltage of one device can have effects on its neighboring devices that operate at a different voltage. For example, the threshold voltage $V_T$ of a metal-oxide-semiconductor (MOS) transistor is often influenced by the voltage on the body. The body effect may create a voltage difference between the body terminals of two devices that operate at different voltage levels. As the voltage on the body varies, the density of electrons in the inversion layer beneath the gate changes, which, in turn, changes the threshold voltage $V_T$.

The voltage on the body is primarily set on the backside of a semiconductor chip. However, there are also other subtle influences. One example is the effect of lateral currents within the chip. Current can escape from circuit elements that are not thoroughly isolated from the rest of the chip. This current may travel laterally in the lower substrate of the chip. Current traversing a resistance induces a voltage drop. So, while the backside of a chip is likely metallized, the voltage may not be the same at all lateral points within the lower substrate beneath active circuit elements. The result is that, even for circuit elements of the same design technology, there can still be differing body voltages. Within a single circuit type, isolation is needed due to the body effect. Moreover, circuits that are designed to operate at different voltages are often designed to operate at different body voltages. Therefore, circuits with different operating voltages cannot be placed on the same semiconductor chip unless they are properly isolated from the influence of the substrate bias voltage. Also, without isolation, there may be punch through between different devices, as the depletion regions of devices that operate at different voltages expand toward each other. A proper isolation design is imperative for a multi-operation-voltages IC.

A typical, conventional isolation structure may occupy a significant amount of layout area on an IC chip. In a circuit that has regions of various operation voltages, the area used for isolation structures increases significantly. Given the constant demand for a more compact IC design, such conventional isolation structure is apparently undesirable.

Therefore, what is needed in the art of semiconductor designs are more compact structures that isolate devices of various operation voltages.

SUMMARY

This invention discloses a semiconductor structure for isolating a first circuit area having at least one first well and a second circuit area having at least one second well, which operate at different voltage levels. In one embodiment of the invention, the semiconductor structure includes an isolation ring disposed on a semiconductor substrate, surrounding the first and second circuit areas. A buried isolation layer continuously extends through the first circuit area and the second circuit area in the semiconductor substrate, wherein the buried isolation layer interfaces with the isolation ring, thereby isolating the first and second circuit areas from a backside bias of the semiconductor substrate. An ion enhanced isolation layer separates the first well in the first circuit area and the second well in the second circuit area from the isolation ring and the buried isolation layer, thereby preventing punch-through between the first and second wells and the buried isolation layer.

The construction and method of operation of the invention, however, together with additional objects and advantages thereof will be best understood from the following description of specific embodiments when read in connection with the accompanying drawings.

DESCRIPTION

Figure 1:
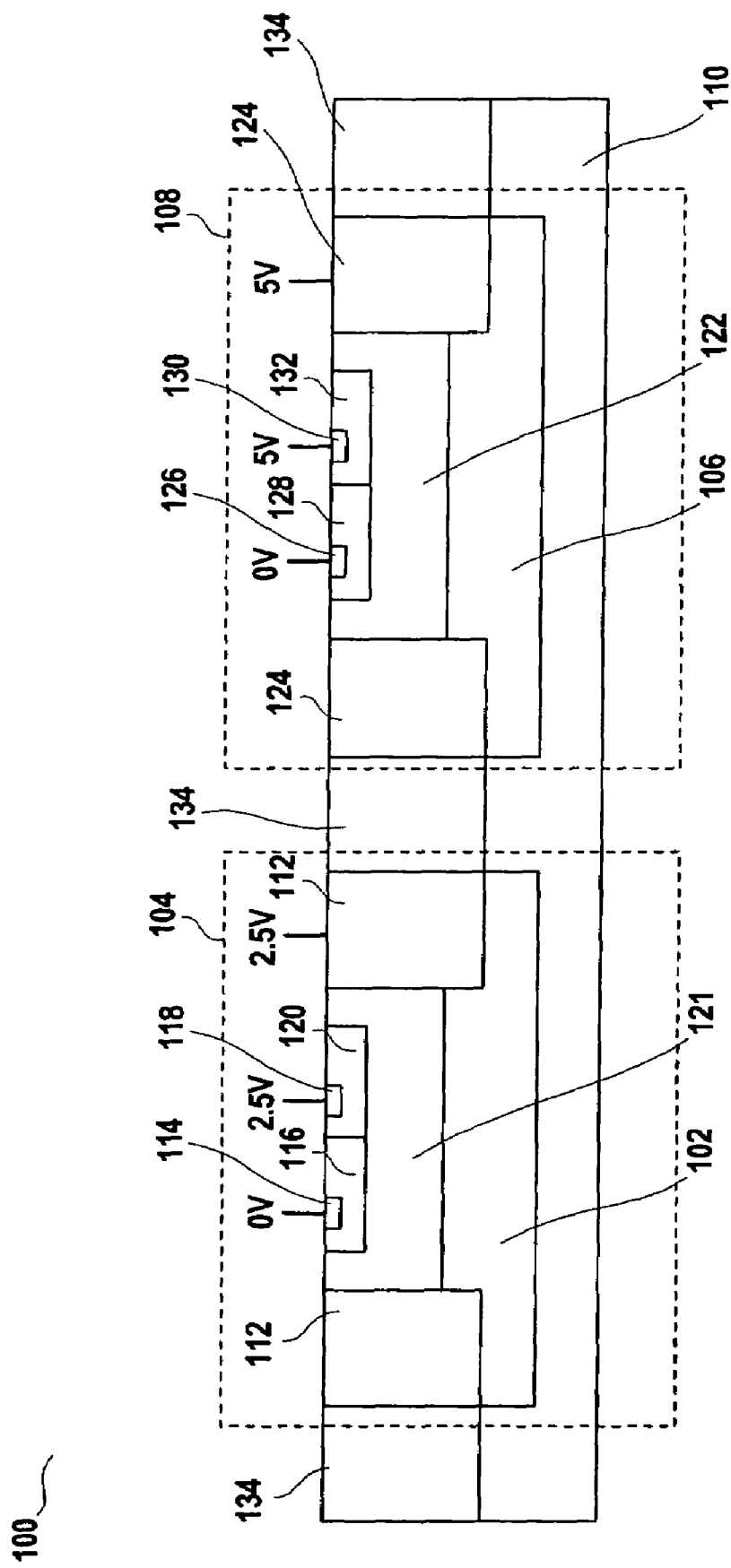
FIG. 1 illustrates a conventional isolation structure for isolating circuit areas of various operation voltages.

FIG. 1 illustrates a cross section view of a conventional semiconductor device 100 that includes an isolation structure for isolating devices of various operation voltages on the same semiconductor substrate 110. Such isolation structure is necessary since the operating voltage of one device can have effects on its neighboring devices that operate at a different voltage, if they are not properly isolated from a backside bias. One of the effects includes an undesired shifting of threshold voltage $V_T$ of a MOS transistor.

The isolation structure includes N-type buried layers 102 and 106 in a P-type semiconductor substrate 110. The isolation structure further includes two separate N-type isolation rings 112 and 124 that interface with the discrete buried layers 102 and 106, defining a low voltage circuit area 104 and a medium voltage circuit area 108, respectively. An N-channel MOS transistor may be placed with a P+ well contact 114 on a P-type well 116. A P-channel MOS transistor that may be placed with an N+ well contact 118 on a N-type well 120. The wells 116 and 120 are formed on a P-type epitaxial (epi) layer 121. The N-type isolation ring 112 is connected to a positive voltage supply, and extends vertically to the N-type buried layer 102, thereby producing an isolating N-type cup for those devices in the low voltage circuit area 104. An N-channel MOS transistor may be placed with a P+ well contact 126 on a P-type well 128. A P-channel MOS transistor may be placed with an N+ well contact 130 on a N-type well 132. The medium voltage circuit 108 is constructed on a P-type epi layer 122, in the same manner as the low voltage circuit area 104. The N-type isolation ring 124 is connected to a positive voltage supply, and extends vertically to the N-type buried layer 106, thereby producing an isolating N-type cup for the devices in the medium voltage circuit area 108. The low voltage circuit area 104 and the medium voltage circuit area 108 are further separated and surrounded by a P-type isolation ring 134 that extends vertically to the P-type substrate 110 common to the whole IC chip. The P-type isolation ring 134, the N-type isolation rings 112 and 124, and the buried layers 102 and 106 ensure that the circuit areas 104 and 108 are properly isolated from one another.

The N-type isolation ring 112 is connected to a 2.5 V power supply, and the P-type substrate 110 is grounded. Thus, a 2.5 V bias appears across the junction between the N-type buried layer 102 and the P-type substrate 110, as well as across the junction between the N-type isolation ring 112 and the P-type isolation ring 134. Similarly, the N-type isolation ring 124 is connected to a 5 V power supply, and the P-type substrate 110 is grounded. Thus, a 5 V bias appears across the junction between the N-type buried layer 106 and the P-type substrate 110, as well as across the junction between the N-type isolation ring 124 and the P-type isolation ring 134. These biased junctions are at some distance from the wells 116 and 120 in the low voltage circuit area 104, and the wells 128 and 132 in the medium voltage circuit area 108. The devices in the low voltage area 104 and the medium voltage area 108 are properly isolated from a backside bias. Thus, the problem of threshold voltage shifting of those devices is eliminated.

While conventional isolation structure may properly isolate the low voltage circuit area 104 from the medium voltage circuit area 108, it occupies an excessive layout area. As discussed above, it takes three structure units, the N-type isolation ring 112, the P-type isolation ring 134 and the N-type isolation ring 124, to separate the low voltage circuit area 104 and the medium voltage circuit area 108, laterally. As such, a more compact isolation structure is strongly desired.

Furthermore, the semiconductor device 100 cannot be easily made more compact by merely eliminating the parts of isolation structure laterally disposed between the low voltage circuit area 104 and the medium voltage circuit area 108. Conventionally, the N-type buried layers 102 and 106 are formed by driving implanted ions into the P-type semiconductor substrate 110 with a thermal treatment process. An initial epi layer is deposited over the N-type buried layers 102 and 106 on the substrate 110. During the high temperature of the deposition process, the P-type impurities in the semiconductor 110 are driven into the initial epi layer. This is the so called "auto-doping" process. The N-type isolation rings 112 and 124, and the P-type isolation ring 134 are formed by processes of ion implantation and thermal treatment that drives the implanted ions deeper into the initial epi layer, thereby constructing the P-type epi layers 121 and 122. Because the P-type impurities are "automatically" doped into the epi-layers 121 and 122, the impurity densities thereof are relatively low. If the parts of isolation structure between the low voltage circuit area 104 and the medium voltage circuit area 108 are removed, a punch through between the wells 116, 120, 128 and 132 and the N-type buried layers 102 and 106 will occur, due to the low impurity densities of the P-type epi layers 121 and 122.

Figure 2:
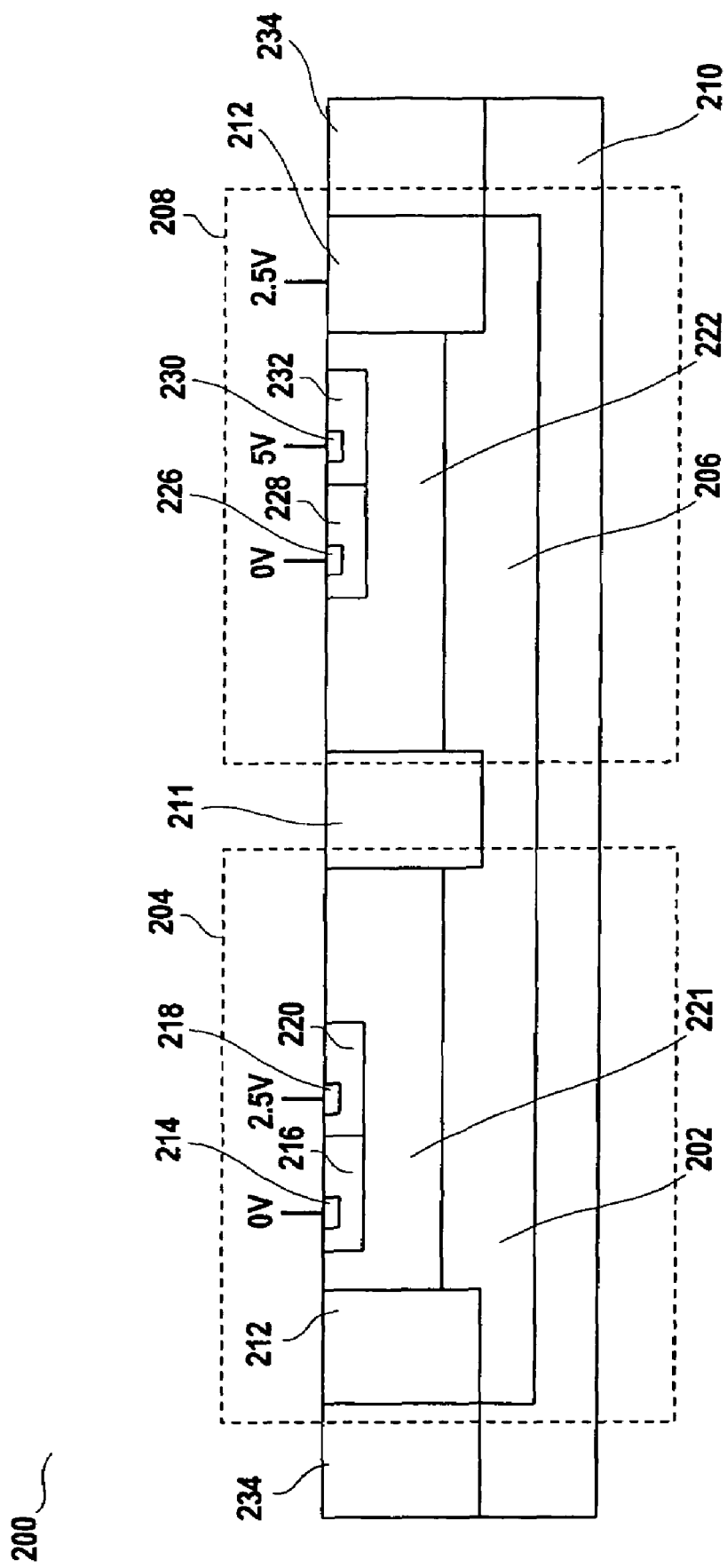
FIG. 2 illustrates an isolation structure for isolating circuit areas of various operation voltages, in accordance with one embodiment of the present invention.

FIG. 2 illustrates a cross-sectional view of semiconductor device structure 200 that includes an isolation structure for isolating devices of various operation voltages on the same P-type semiconductor substrate 210, but with less layout area occupied, in accordance with one embodiment of the present invention. The first and second voltage circuit areas 204 and 208, which operate at different voltage levels, appear similarly as those in FIG. 1. The isolation structure includes an N-type buried layer 202, in the first voltage circuit area 204, and an N-type buried layer 206, in the second voltage circuit area 208. The N-type buried layer 206 is continuous with the N-type buried layer 202, and extends through the first and second voltage circuit areas 204 and 208. An N-type isolation ring 212 extends vertically to, and interfaces with the N-type buried layers 202 and 206. An isolation wall 211, such as an N well, disposed between the first and second voltage circuit areas 204 and 208, extends vertically to, and interfaces with the N-type buried layers 202 and 206. The left wing of the isolation ring 212 and the isolation wall 211 provide an isolating N-type cup for the first voltage circuit area 204. In the first voltage circuit area 204, an N-channel MOS transistor may be placed with a P+ well contact 214 on a P-type well 216. A P-channel MOS transistor may be placed with an N+ well contact 218 on an N-type well 220. The right wing of the isolation ring 212 and the isolation wall 211 provide an isolating N-type cup for the second voltage circuit area 208. In the second voltage circuit area 208, an N-channel MOS transistor may be placed with a P+ well contact 226 on a P-type well 228. A P-channel MOS transistor may be placed with an N+ well contact 230 on an N-type well 232. As a result, there is only one line of the N-type isolation wall 211 between the first voltage circuit area 204 and the second voltage circuit area 208, instead of the three lines that appear in FIG. 1. This saves a significant amount of layout area.

The first voltage circuit area 204 and the second voltage circuit area 208 are surrounded, but not separated, by a guard ring 234, such as a P-type isolation ring. The guard ring 234 extends vertically to, and interfaces with the P-type substrate 210 common to the whole IC chip. The guard ring 234, the N-type isolation ring 212, the isolation wall 211 and the buried layers 202 and 206 ensure that the circuit areas are isolated from one another and from a backside bias. The isolation ring 212 is connected to a positive power supply, thereby creating a bias for the ring as opposed to its neighboring structures. For example, a 2.5-volt bias between the N-type isolation ring 212 and the P-type substrate 210 appears across the junction between the N-type buried layer 202 and the P-type substrate 210, as well as across the junction between the N-type isolation ring 212 and the guard ring 234. Similarly, a 2.5-volt bias between the N-type isolation ring 212 and the P-type substrate 210 appears across the junction between the N-type buried layer 206 and the P-type substrate 210. It is noteworthy that continuity exists between the N-type buried layer 202 and the N-type buried layer 206. This provides an appropriate isolation for the first voltage circuit area 204 and the second voltage circuit area 208 from the backside bias. Therefore, the shifting threshold voltages of MOS transistors of both circuit areas are substantially free from influences of the undesired electrical interaction caused by the backside bias.

The isolation layer 221 separating the wells 216 and 220 from the N-type isolation ring 212 and N-type buried layer 202 is enhanced with ions to provide an increased impurity density as opposed to that of the P-type epi layer 121 shown in FIG. 1. Likewise, the isolation layer 222 separating the wells 228 and 232 from the N-type isolation ring and the N-type buried layer 206 is enhanced with ions to provide an increased impurity density as opposed to that of the P-type epi layer 122 shown in FIG. 1. The impurity densities of the ion enhanced isolation layers 221 and 222 are suggested to range from $1\times10^{12}$ to $5\times10^{14}$ atoms/cm$^2$. These ion enhanced isolation layers 221 and 222 prevent punch-through between the N-type buried layers 202 and 206 and wells 216, 220, 228 and 232 in the first or second voltage circuit areas 204 and 208.

There are many ways to realize the ion enhanced isolation layers 221 and 222 with an impurity density in the suggested range. In this embodiment, the ion enhanced isolation layers 221 and 222 are formed firstly by depositing an epi layer over the N-type buried layer 202 and 206 on the substrate 210. A mega (high energy) ion implantation process is performed to adjust the impurity densities in the ion enhanced isolation layers 221 and 222 to an appropriate and desired level. For example, P-type ions can be implanted into the ion enhanced isolation layers 221 and 222 at an energy level ranging from 1.0 to 3.0 MeV. As an alternative, the impurity density level in the ion enhanced isolation layers 221 and 222 can be realized by a series of steps including an initial ion implantation and thermal treatment. This alternative is similar to the processes of forming the "drive-in" wells, such as the N-type isolation rings 212, isolation wall 211 and P-type isolation rings 234.

In another embodiment of the present invention, the isolation wall 211 can be omitted, and the ion enhanced isolation layers 221 and 222 become a continuous layer. This embodiment can provide an even more compact layout for the first and second voltage circuit areas 204 and 208.

Figure 3:
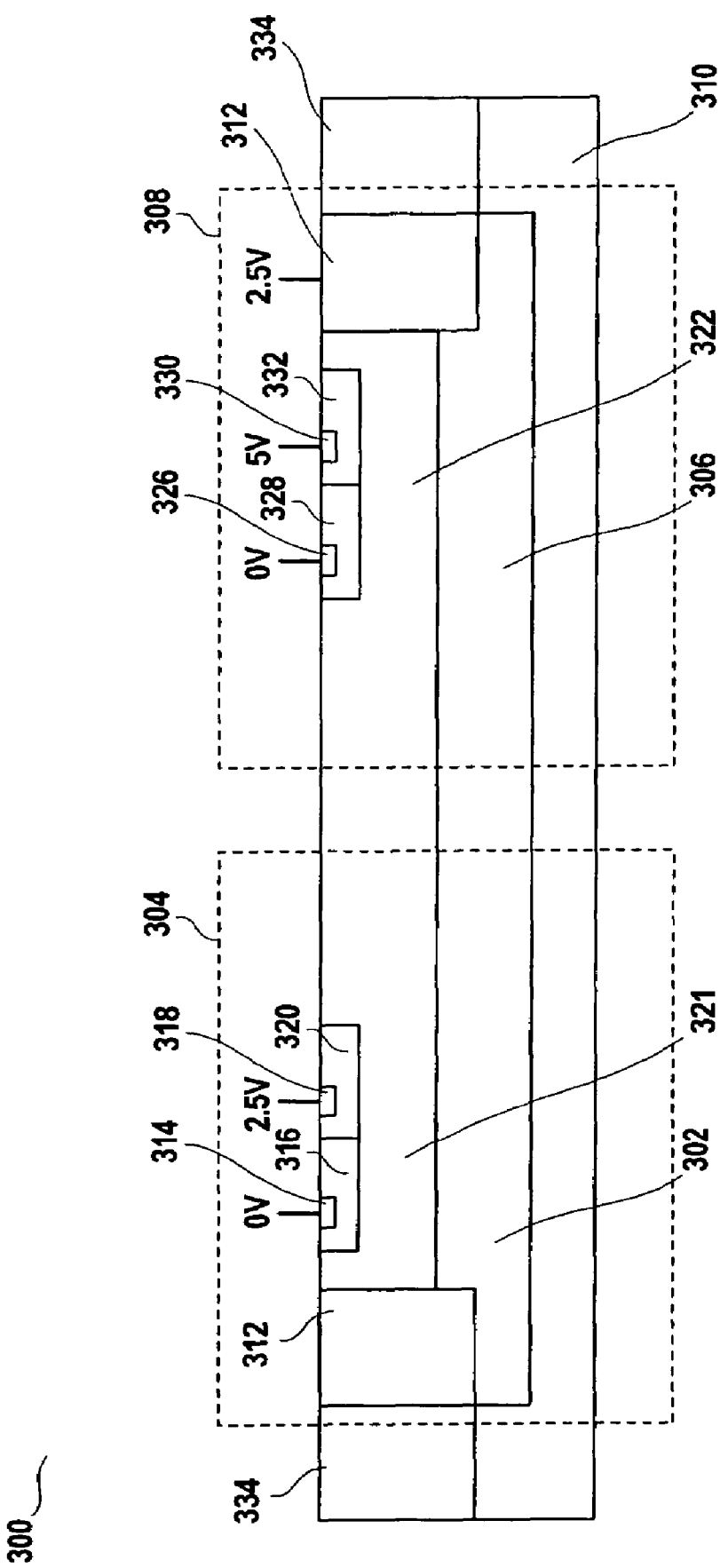
FIG. 3 illustrates an isolation structure for isolating circuit areas of various operation voltages, in accordance with another embodiment of the present invention.

FIG. 3 illustrates a cross-sectional view of semiconductor device structure 300 that includes an isolation structure for isolating devices of various operation voltages on the same P-type semiconductor substrate 310, but with less layout area occupied. The first and second voltage circuit areas 304 and 308, which operate at different voltage levels, appear similarly as those in FIG. 1. The isolation structure includes an N-type buried layer 302 that runs across the first and second voltage circuit areas 304 and 308. An N-type isolation ring 312 extends vertically to, and interfaces with the N-type buried layer 302. This provides an isolating N-type cup for the first and second voltage circuit areas 304 and 308. In the first voltage circuit area 304, an N-channel MOS transistor may be placed with a P+ well contact 314 on a P-type well 316. A P-channel MOS transistor may be placed with an N+ well contact 318 on an N-type well 320. In the second voltage circuit area 308, an N-channel MOS transistor may be placed with a P+ well contact 326 on a P-type well 328. A P-channel MOS transistor may be placed with an N+ well contact 330 on an N-type well 332. As a result, the semiconductor device structure 300 can be made compact.

The first voltage circuit area 304 and the second voltage circuit area 308 are surrounded by a guard ring 334, such as a P-type isolation ring. The guard ring 334 extends vertically to, and interfaces with the P-type substrate 310 common to the whole IC chip. The guard ring 334, the N-type isolation ring 312, and the buried layer 302 ensure that the circuit areas are isolated from a backside bias. The isolation ring 312 can be connected to a positive power supply, thereby creating a bias for the ring as opposed to its neighboring structures. For example, a 2.5-volt bias between the N-type isolation ring 312 and the P-type substrate 310 appears across the junction between the N-type buried layer 302 and the P-type substrate 310, as well as across the junction between the N-type isolation ring 312 and the guard ring 334. This provides an appropriate isolation for the first and second voltage circuit areas 304 and 308 from the backside bias. Therefore, the shifting threshold voltages of MOS transistors of both circuit areas are substantially free from influences of the undesired electrical interaction caused by the backside bias.

The isolation layer 321 and the isolation layer 322 become a continuous layer. The isolation layer 321 separating the wells 316, 320 from the isolation ring 312 and N-type buried layer 302 is enhanced with ions to provide an increased impurity density as opposed to that of the P-type epi layer 121 shown in FIG. 1. The isolation layer 322 separating the wells 328 and 332 from the isolation ring 312 and N-type buried layer 306 is enhanced with ions to provide an increased impurity density as opposed to that of the P-type epi layer 122 shown in FIG. 1. The impurity density of the ion enhanced isolation layer 321 or 322 is suggested to range from $1 \times 10^{12}$ to $5 \times 10^{14}$ atoms/cm$^2$. The ion enhanced isolation layer 321 or 322 prevents punch-through between the N-type buried layer 302 and wells 316, 320, 328 and 332 in the first or second voltage circuit areas 304 and 308.

There are many ways to realize the ion enhanced isolation layer 321 with an impurity in the suggested range. In this embodiment, the ion enhanced isolation layer 321 is formed firstly by depositing an epi layer over the N-type buried layer 302 on the substrate 310. A mega (high energy) ion implantation process is performed to adjust the impurity density in the ion enhanced isolation layer 321 to an appropriate and desired level. For example, P-type ions can be implanted into the ion enhanced isolation layer 321 at an energy level ranging from 1.0 to 3.0 MeV. As an alternative, the impurity density level in the ion enhanced isolation layer 321 can be realized by a series of steps including an initial ion implantation and thermal treatment. This alternative is similar to the processes of forming the "drive-in" wells, such as the N-type isolation ring 312, and P-type isolation rings 334.

These embodiments are proposed based on a P-type substrate. However, an N-type substrate may be used to implement the present invention in the same way as described above. For example, the polarity of the various parts of the semiconductor device structure 200 may be inversed, provided that the isolation rings and the ion enhanced isolation layers are of opposite polarities. Likewise, the isolation rings/buried layer and semiconductor substrate should be of opposite polarities, too. It is understood that those skilled in the art can implement this embodiment without difficulties.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A semiconductor structure for isolating a first circuit area and a second circuit area, which operate at different voltage levels, comprising:
   an isolation ring disposed on a semiconductor substrate, surrounding the first and second circuit areas;
   a buried isolation layer continuously extending through the first circuit area and the second circuit area in the semiconductor substrate, wherein the buried isolation layer interfaces with the isolation ring, thereby isolating the first and second circuit areas from a backside bias of the semiconductor substrate; and an ion enhanced isolation layer separating devices in the first and second circuit areas from the isolation ring and the buried isolation layer,
wherein the ion enhanced isolation layer is of an opposite polarity to the isolation ring and the buried isolation layer.

2. The semiconductor structure of claim 1 wherein the ion enhanced isolation layer is implanted with ions at an implant energy from 1.0 to 3.0 MeV.

3. The semiconductor structure of claim 1 wherein the ion enhanced isolation layer has an ion density between $1 \times 10^{12}$ and $5 \times 10^{14}$ atoms/cm$^2$.

4. The semiconductor structure of claim 1 wherein the semiconductor substrate is of an opposite polarity to the isolation ring and the buried isolation layer.

5. The semiconductor structure of claim 1 wherein the isolation ring is at a positive voltage level.

6. The semiconductor structure of claim 1 further comprising an isolation wall disposed between the first and second circuit areas, and interfaced with the buried isolation layer.

7. The semiconductor structure of claim 1 further comprising a guard ring surrounding the isolation ring.

8. A semiconductor structure for isolating a first circuit area having at least one first well and a second circuit area having at least one second well, which operate at different voltage levels, comprising:
    an isolation ring disposed on a semiconductor substrate, surrounding the first and second circuit areas;
    a buried isolation layer continuously extending through the first circuit area and the second circuit area in the semiconductor substrate, wherein the buried isolation layer interfaces with the isolation ring; and
    an ion enhanced isolation layer separating the first well in the first circuit area and the second well in the second circuit areas from the isolation ring and the buried isolation layer, thereby preventing punch-through between the first and second wells and the buried isolation layer,
    wherein the ion enhanced isolation layer has an ion density between $1 \times 10^{12}$ and $5 \times 10^{14}$ atoms/cm$^2$.

9. The semiconductor structure of claim 8 wherein the ion enhanced isolation layer is implanted with ions at an implant energy from 1.0 to 3.0 MeV.

10. The semiconductor structure of claim 8 wherein the ion enhanced isolation layer is of an opposite polarity to the isolation ring and the buried isolation layer.

11. The semiconductor structure of claim 8 wherein the semiconductor substrate is of an opposite polarity to the isolation ring and the buried isolation layer.

12. The semiconductor structure of claim 8 further comprising an isolation wall disposed between the first and second circuit areas, and interfaced with the buried isolation layer.

13. The semiconductor structure of claim 8 further comprising a guard ring surrounding the isolation ring.

14. A semiconductor structure for isolating a first circuit area and a second circuit area, which operate at different voltage levels, comprising:
    a first isolation ring surrounding the first circuit area, disposed on a semiconductor substrate;
    a second isolation ring surrounding the second circuit area, disposed on the semiconductor substrate, wherein the first isolation ring and the second isolation ring share an isolation wall;
    a buried isolation layer continuously extending through the first circuit area and the second circuit area, in the semiconductor substrate, wherein the buried isolation layer interfaces with the first isolation ring and the second isolation ring;
    a first ion enhanced isolation layer separating devices in the first circuit area from the first isolation ring and the buried isolation layer; and
    a second ion enhanced isolation layer separating devices in the second circuit area from the second isolation ring and the buried isolation layer, wherein the first and second ion enhanced isolation layers have an ion density from $1 \times 10^{12}$ to $5 \times 10^{14}$ atoms/cm$^2$, thereby isolating the first and second circuit areas from a backside bias of the semiconductor substrate.

15. The semiconductor structure of claim 14 wherein the first and second ion enhanced isolation layers are implanted with ions at an implant energy from 1.0 to 3.0 MeV.

16. The semiconductor structure of claim 14 wherein the first and second ion enhanced isolation layers are of an opposite polarity to the first and second isolation rings and the buried isolation layer.

17. The semiconductor structure of claim 14 wherein the semiconductor substrate is of an opposite polarity to the first and second isolation rings and the buried isolation layer.

18. The semiconductor structure of claim 14 further comprising a guard ring surrounding the first and second isolation rings.

* * * * *